United States Patent [19]

Umeda et al.

[11] Patent Number: 5,896,051
[45] Date of Patent: Apr. 20, 1999

[54] OUTPUT CIRCUIT AND OUTPUT CIRCUIT DEVICE

[75] Inventors: Toshiyuki Umeda, Tokyo; Kunio Yoshihara, Yokohama, both of Japan

[73] Assignee: Kabushiki Kaisha Toshiba, Kawasaki, Japan

[21] Appl. No.: 08/790,995

[22] Filed: Jan. 30, 1997

[30] Foreign Application Priority Data

Feb. 2, 1996 [JP] Japan ..................... 8-017446

[51] Int. Cl.$^6$ ..................... H03S 5/26
[52] U.S. Cl. ..................... 327/77; 327/89; 327/563
[58] Field of Search ..................... 327/65, 66, 67, 327/77, 89, 563; 326/30, 90

[56] References Cited

U.S. PATENT DOCUMENTS

| | | | |
|---|---|---|---|
| 3,848,139 | 11/1974 | Holt, Jr. ..................... | 307/235 R |
| 5,382,849 | 1/1995 | Fenk et al. ..................... | 327/310 |
| 5,541,538 | 7/1996 | Bacrania et al. ..................... | 327/77 |
| 5,614,860 | 3/1997 | Osaki et al. ..................... | 327/552 |

FOREIGN PATENT DOCUMENTS 8-56034  2/1996  Japan .

OTHER PUBLICATIONS

H.-M. Rein, et al. "A Versatile Si–Bipolar Driver Circuit with High Output Voltage Swing for External and Direct Laser Modulation in 10 Gb/s Optical–Fiber Links", IEEE Journal of Solid–State Circuits, vol. 29, No. 9, pp. 1014–1021, Sep., 1994.

Primary Examiner—Timothy P. Callahan
Assistant Examiner—An T. Luu
Attorney, Agent, or Firm—Oblon, Spivak, McClelland, Maier & Neustadt, P.C.

[57] ABSTRACT

An output circuit comprising a pair of input-stage transistors supplied with an input signal, a pair of output-stage differential transistors constructing an output-stage differential circuit, a pair of wiring lines having first ends connected to the input-stage transistors, respectively, and second ends connected to the bases of the output-stage differential transistors and connecting the input-stage transistors and the output-stage transistors, respectively, a pair of input-stage constant current sources connected to the bases of the output-stage differential transistors, respectively, at the second terminals, and an output-stage constant current source connected to the output-stage differential transistors.

4 Claims, 5 Drawing Sheets

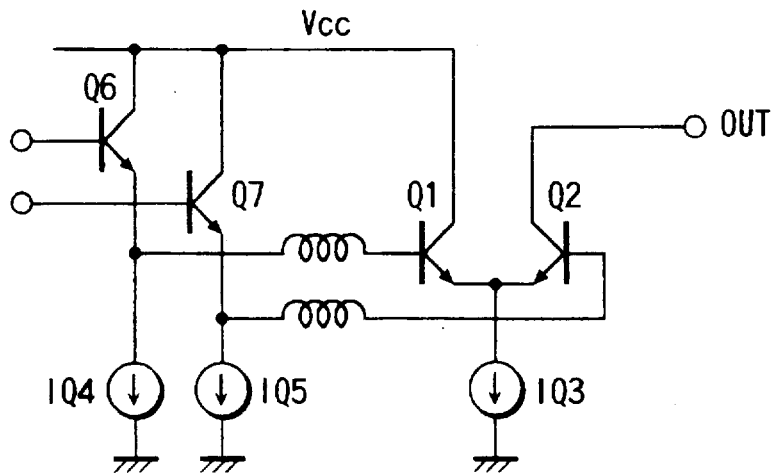
FIG. 3 (PRIOR ART)
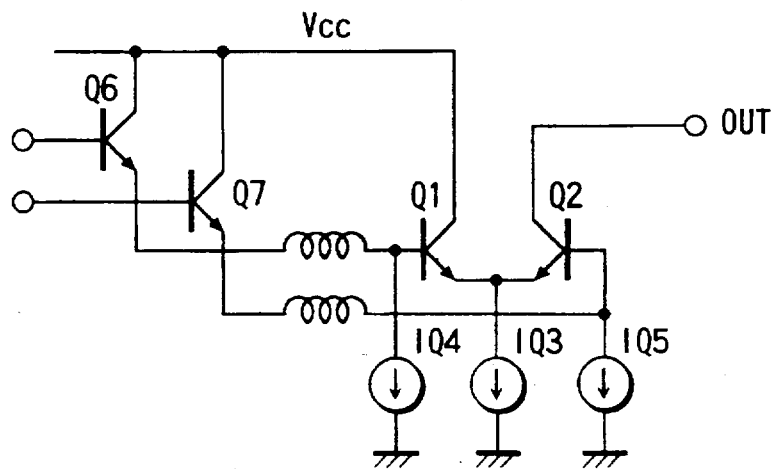
FIG. 4 (PRESENT INVENTION)
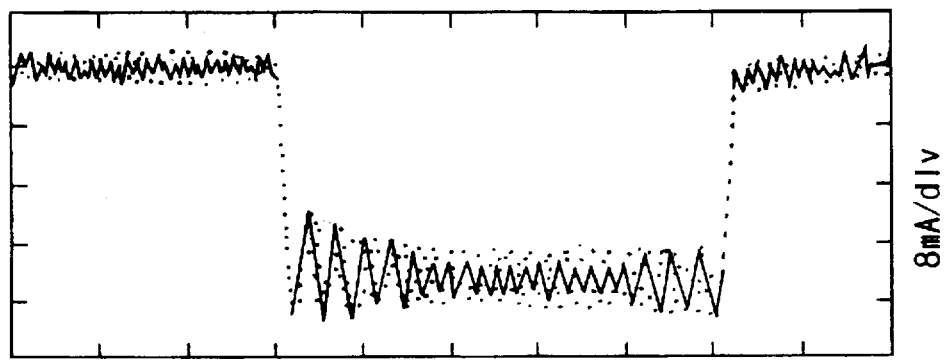
FIG. 5
PRIOR ART

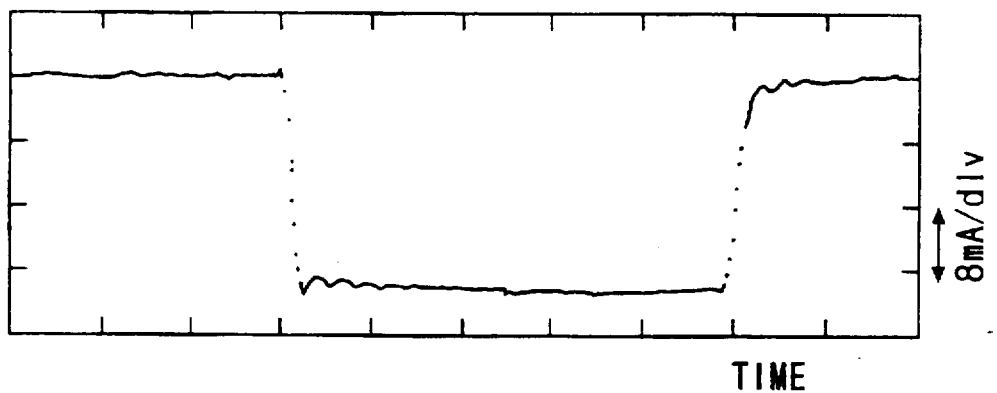
F I G. 6
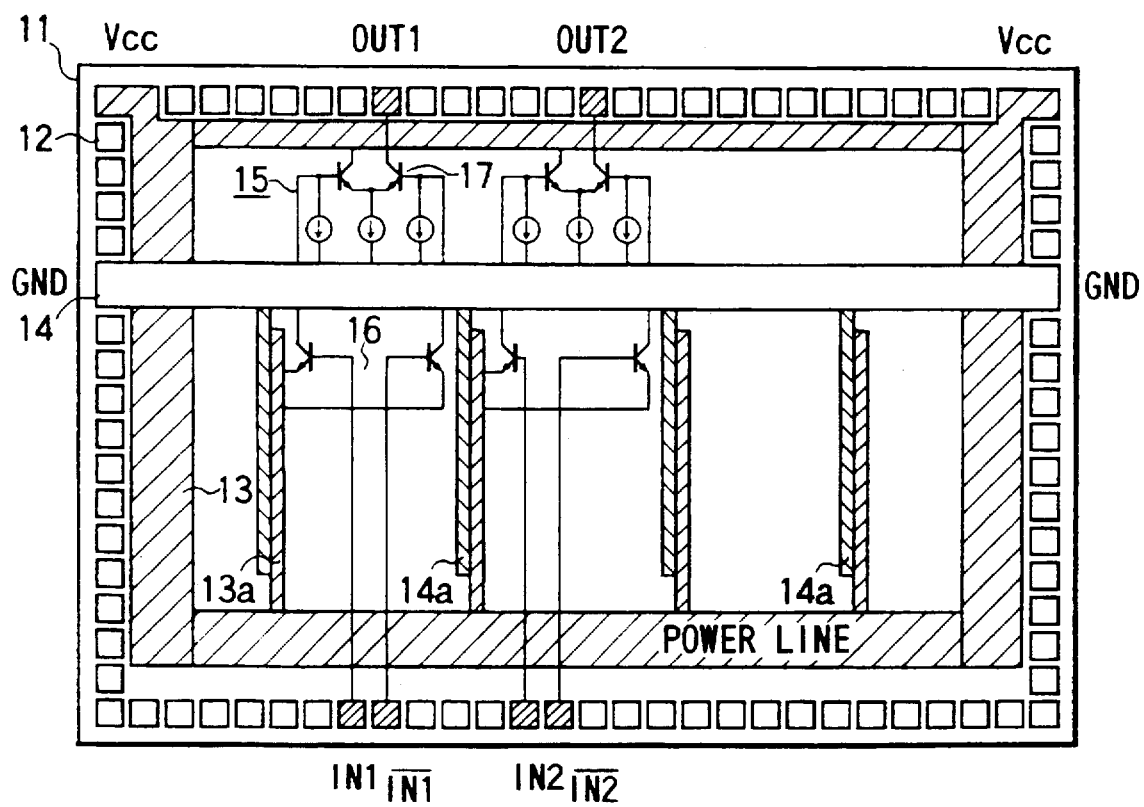
F I G. 7

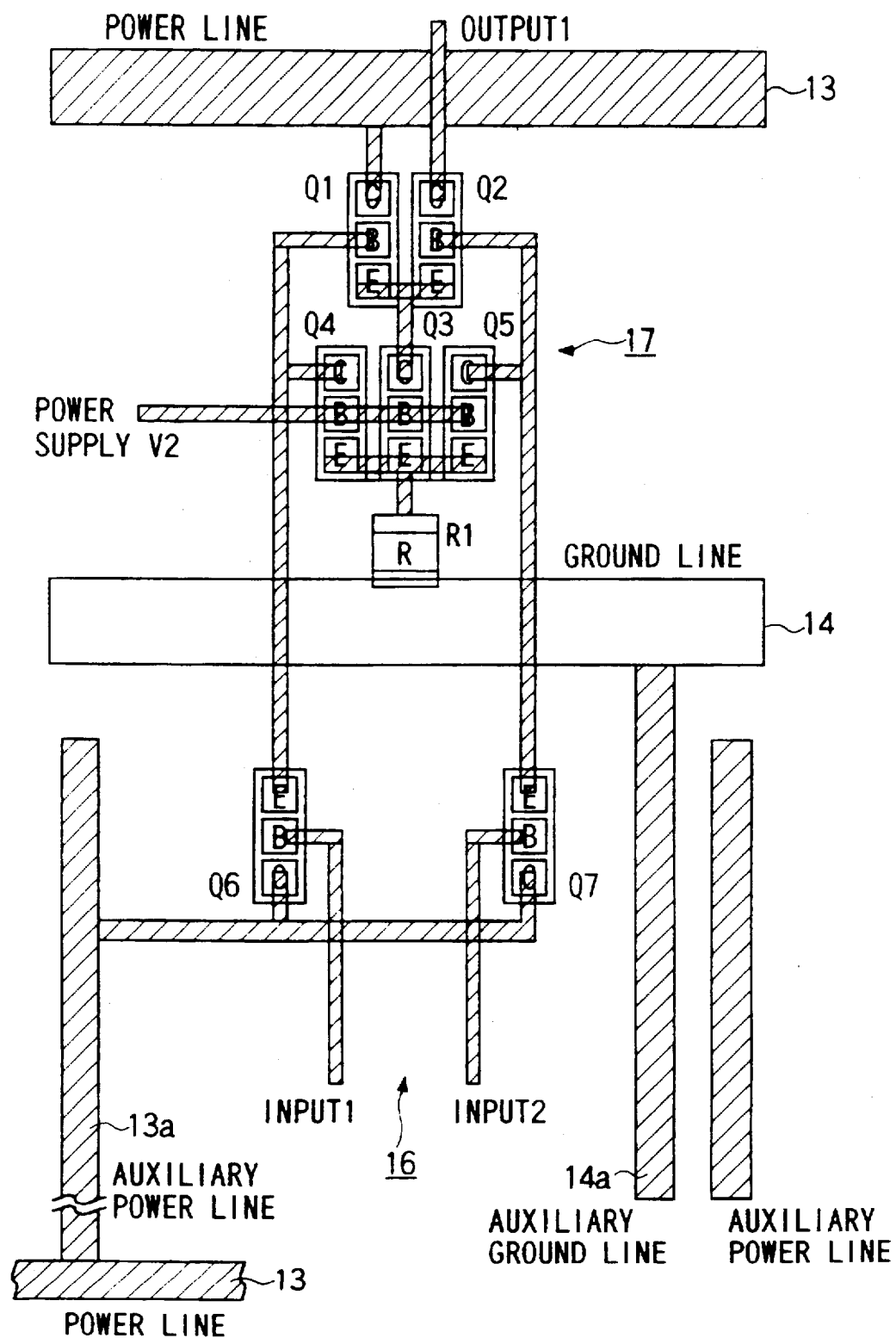
F I G. 8

OUTPUT CIRCUIT AND OUTPUT CIRCUIT DEVICE

BACKGROUND OF THE INVENTION

The present invention relates to an output circuit and output circuit device for driving a laser diode or the like at high speed.

A conventional output circuit for supplying a drive signal to a laser diode or the like at high speed comprises an emitter follower circuit and a differential circuit. The emitter follower circuit receives a differential signal input to the output circuit device. The differential circuit is driven by a signal output by the emitter follower. In the device, the power supply for the emitter follower circuit is located near the emitter follower transistor.

The output transistor incorporated in the output circuit device must be a large-size one so that the device may convert a high-frequency signal into a large output current. The large the output transistor, the greater its ground parasitic capacity. Ringing inevitably occurs when the output transistor operates at high speed. Hence, the differential transistors incorporated in the device may oscillate if their base terminals are electrically unstable. To remove this phenomenon, an integration circuit is used to abate the waveform sharpness of the signal input to the differential transistors. As a consequence, the output circuit device cannot supply a drive signal at high speed.

BRIEF SUMMARY OF THE INVENTION

The object of the present invention is to provide an output circuit and output circuit device which can output a signal of a stable waveform and which can supply the signal at high speed.

According to the invention there is provided an output circuit which comprises: a pair of input-stage transistors supplied with an input signal; a pair of output-stage differential transistors constructing an output-stage differential circuit; a pair of wiring lines having first ends connected to the input-stage transistors, respectively, and second ends connected to control terminals of the output-stage differential transistors and connecting the input-stage transistors and the output-stage transistors, respectively; a pair of input-stage constant current sources connected to the control terminals of the output-stage differential transistors, respectively, at the second ends; and a output-stage constant current source connected to the output-stage differential transistors.

According to the invention there is provided an output circuit device which comprises: a pair of input-stage transistor regions supplied with an input signal; a pair of output-stage differential transistor regions constructing an output-stage differential circuit; an output-stage constant current source transistor region constituting a constant current source for the output-stage differential circuit; a pair of wiring line layers connecting the input-stage transistor regions and the output-stage differential transistor regions to each other, respectively; and a pair of input-stage constant current-source transistor regions arranged near the output-stage constant current source transistor region and connected to control terminals of the differential transistor regions, respectively, in the vicinity of the differential transistor regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a schematic circuit diagram of a conventional output circuit device;

FIG. 4 is a schematic circuit diagram of the device shown in FIG. 1;

FIG. 5 illustrates the waveform of the signal output by the conventional output circuit device;

FIG. 6 is represents the waveform of the signal output by the device shown in FIG. 1;

FIG. 7 is a diagram showing the component layout of an IC chip incorporating a plurality of identical output circuit devices which are a second embodiment of the invention;

FIG. 8 is a diagram illustrating the component layout of one of the output circuit devices incorporated in the IC chip of FIG. 7;

DETAILED DESCRIPTION OF THE INVENTION

An output circuit device according to the first embodiment of the invention will be described, with reference to FIG. 1.

Figure 1:
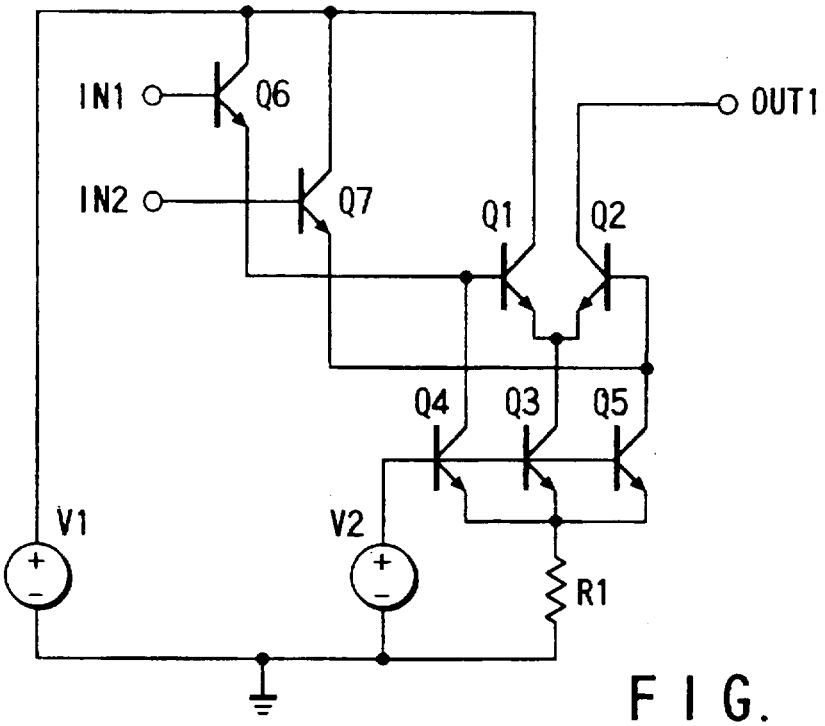
FIG. 1 is a circuit diagram of an output circuit device according to a first embodiment of the present invention.

As shown in FIG. 1, the output circuit device comprises an input-stage emitter follower circuit and an output-stage differential circuit. The output-stage differential circuit comprises a pair of transistors Q1 and Q2, and a transistor Q3 constructing a constant current source. The input-stage emitter follower circuit comprises a pair of emitter followers, one being fabricated by a transistor Q4 constructing a constant current source and a transistor Q6 connected to an input terminal IN1, and the other a transistor Q5 constructing a constant current source and a transistor Q7 connected to an input terminal IN2.

In other words, in the output-stage differential circuit, the emitters of the differential transistors Q1 and Q2 are connected to each other, and grounded via the collector-emitter path of the differential transistors Q3 and a resistor R1. The collector of the differential transistor Q1 is connected to the power source V1, and the collector of the transistor Q2 to an output terminal OUT1 which is connected to a load device of a comparatively large power consumption.

In the input-stage emitter follower circuit, the emitter-flower transistors Q6 and Q7 have their bases connected to the input terminals IN1 and IN2, respectively, their collectors connected to a power supply V1, and their emitters (i.e., charge injection terminals) connected to the bases of the differential transistors Q1 and Q2, respectively. The emitters of the transistors Q6 and Q7 are also connected by wiring lines to the collectors (i.e., charge collecting terminals) of the current-source transistors Q4 and Q5, respectively, which are located in the vicinity of the differential transistors Q1 and Q2. The bases of the transistors Q3, Q4 and Q5, i.e., the constant current sources, are connected in series to the power supply V2.

When differential signals are input through the input terminals IN1 and IN2 to the emitter-follower transistors Q6 and Q7, respectively, the differential transistors Q1 and Q2 operate, whereby the differential circuit generates a large current. In other words, the high-frequency signals input to the emitter follower circuit (Q6, Q7) are converted into a large current, which is supplied to, for example, a laser diode.

Figure 2:
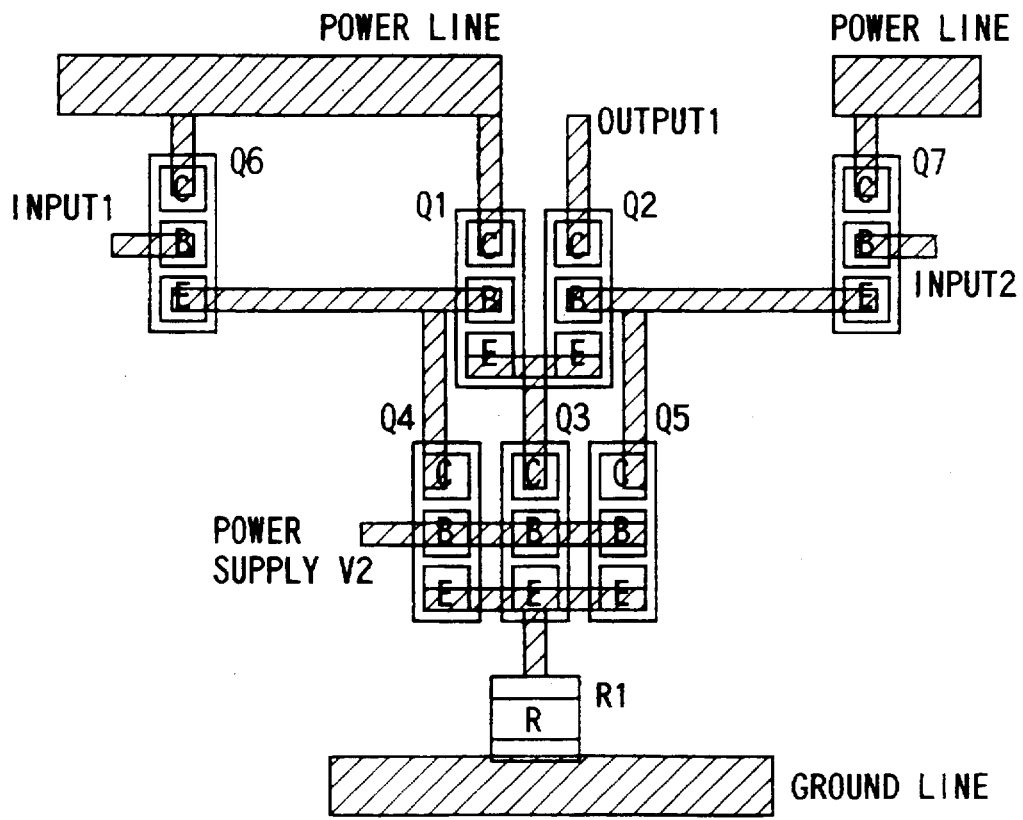
FIG. 2 is a diagram representing the component layout of the device shown in FIG. 1.

The output stage device described above has its components arranged as shown in FIG. 2. In FIG. 2, the transistors Q1 to Q7 are schematically represented. The squares C, squares B and squares E designate the collector terminals, base terminals and emitter terminals of the transistors Q1 to Q7.

As seen From FIG. 2, the regions of the transistors Q4 and Q5 functioning as the constant current sources of the input stage are located near the region of the transistor Q3 used as the constant current source of the output stage, and symmetrically with respect thereto. The regions of these transistors Q3, Q4 and Q5 forms a rectangular region. On one side of the rectangular region (i.e., the upper side in FIG. 2) are arranged the regions of the differential transistors Q1 and Q2. The regions of the emitter-follower transistors Q6 and Q7 are provided symmetrically with respect to, at a c: relatively long distance respectively from, the region formed of the regions of the differential transistors Q1 and Q2. The region of the resistor R1 is located on the other side (i.e., the lower side in FIG. 2) of the rectangular area including the regions of the transistors Q3, Q4 and Q5. The region of the transistor R1 is connected to a ground line provided near this region. Power lines are provided close to the transistors Q1, Q2, Q6 and Q7. Wiring lines are connected to the collectors C of these transistors Q1, Q2 and Q6 and Q7.

The emitters E of the emitter-follower transistors Q6 and Q7 are connected to the bases B of the differential transistors Q1 and Q2, respectively, by comparatively long wiring lines. The collectors C of the current-source transistors Q4 and Q5 of the emitter follower circuit are connected to the bases B of the, differential transistors Q1 and Q2, respectively, by relatively short wiring lines, in the vicinity of the bases B of the differential transistors Q1 and Q2. In other words, the collectors C of the transistors Q4 and Q5 are connected substantially directly to the bases B of the transistors Q1 and Q2.

The emitters of the differential transistors Q1 and Q2 are connected to each other by wiring lines. The emitter node of these transistors Q1 and Q2 is connected to the collector C of the transistor Q3 incorporated in the differential circuit, or the output stage of the device. The bases B of the constant current-source transistors Q3, Q4 and Q5 are connected to the power supply V2 by wiring lines. The emitters E of these transistors Q3, Q4 and Q5 are connected to the resistor R1.

As shown in FIG. 2, the differential transistors Q1 and Q2 of the output stage are arranged at a relatively long distance from the emitter-follower transistors Q6 and Q7 incorporated in the input stage; the current-source transistors Q4 and Q5 of the emitter follower are located near the current-source transistor Q3 of the output stage; and the collectors C of these transistors Q4 and Q5 are connected to the bases B of the differential transistors Q1 and Q2 by short wiring lines in the vicinity of the bases B thereof. Therefore, the output stage of the output stage device, i.e., the base terminals of the differential circuit, is more stable than otherwise. The output stage device can output a drive signal at high speed, without causing ringing, though long wiring lines are used which connect the emitter follower circuit (i.e., the input stage) to the differential circuit (i.e., the output stage).

Why the device can output a drive signal at high speed, without causing ringing, will be explained, with reference to FIGS. 3 and 4. FIG. 3 is a schematic diagram of a conventional output stage. FIG. 4 is an equivalent circuit of the output stage device, which is shown in FIGS. 1 and 2.

In the conventional device, the current sources IQ4 and IQ5 of the emitter follower are connected to the emitter-follower transistors Q6 and Q7, in vicinity thereof as illustrated in FIG. 3. Thus, an about 0.5nH-inductor is connected in series between the emitter follower circuit (i.e., the input stage) and the differential circuit (i.e., the output stage) when the length of the wiring line is about 0.5 mm. The inductor is the reactance component of the signal line (wiring line) which connects the two circuits.

In contrast, in the output stage device of this invention, the constant current sources (constant current transistor or resistor) IQ4 and IQ5 are connected to the transistors Q1 and Q2 of the differential circuit in vicinity thereof as is shown in FIG. 4. In Other words, the input-stage constant current sources IQ4 and IQ5 are connected substantially directly to the transistors Q1 and Q2 of the output-stage differential circuit which is connected to the output-stage constant current source (constant current source transistor or resistor) IQ3. In other words, the wiring lines connecting the constant current sources to the differential circuit are short. As a result, in a circuit operation frequency, the impedance viewing the input-stage constant current sources IQ4 and IQ5 from the output-stage differential transistors Q1 and Q2 is lower than that viewing the emitter follower transistors Q6 and Q7 via the wiring line.

When the conventional output stage (FIG. 3) operates at high speed, the switching noise produced in the output stage differential circuit is fed back to the bases of the output stage transistors Q1 and Q2. As a result, persistent ringing and jitter noise will be generated in the output signal as is illustrated in FIG. 5.

By contrast, according to this invention, both ringing and jitter noise in the output signal of the output stage are far less prominent as seen from FIG. 6, since the switching noise is transferred through the input-stage current sources IQ4 and IQ5 to the ground. In other words, the signal output by the output stage of the invention has a stable, desired waveform, having only a little noise.

An integrated circuit, or an IC chip, which incorporates a plurality of identical output stages according to the second embodiment will be described, with reference to FIG. 7.

As shown in FIG. 7, a number of pads 12 are arranged on the peripheral edges of the IC chip 11. A power supply line 13 is formed inside an array of the pads 12. A ground line 14 extends straight across the IC chip 11. A plurality of identical output stage devices 15 are fabricated on the center part of the IC chip 11. The input stage 16 and the output stage 17 of each of the output circuits 15 are arranged on the regions separated by the ground line 14. More precisely, the output stages 17, each including a differential circuit and a current source, are arranged in the region above the ground line 14, while the input stages 16 are arranged in the region below the ground line 14, as viewed in FIG. 7. An auxiliary power line 13a and an auxiliary ground line 14a are provided among the input stages 16.

As seen from FIG. 7, the input stages 16 are spaced apart from the output stages 17 due to the ground line 14. The signal lines which connect the emitter follower circuits of the input stages 16 to the bases of the differential transistors incorporated in the output states 17 are therefore relatively long. However, since the constant current sources for the emitter follower circuits of the input stages 16 are located on the left and right sides of the constant current sources of the output stages 17, the inductance component of each signal line extending over the ground line 14 can be extremely reduced. Furthermore, the main power line 13 is mounted on the edges of the chip 11, the emitter follower circuits of the input stages 16 are supplied with power independently, and the output stages 17 are supplied with power independently. Accordingly, the crosstalk between any two adjacent output circuit devices 15 can be extremely reduced.

One of the identical output circuit devices 15 will be described in detail, with reference to FIG. 8.

As illustrated in FIG. 8, the differential transistors Q1 and Q2 and the constant current-source transistors Q3, Q4 and Q5 are arranged exactly in the same way as in the output circuit device shown in FIG. 2. That is, the current-source transistors Q4 and Q5 of the input stage are located near the current-source transistor Q3, symmetrically with respect to the transistor Q3. The differential transistors Q1 and Q2 of the output stage 17 are arranged on one side (or the upper side) of the rectangular region in which the transistors Q3, Q4 and Q5 are provided. A resistor R1 is located on the other side (or the lower side) of that rectangular region. The resistor R1 is connected to the ground line 14.

The emitter-follower transistors Q6 and Q7 of the output stage 16 are arranged below the ground line 14 as viewed in FIG. 8. The emitters E of the transistors Q6 and Q7 are connected by wiring lines to the bases B of the differential transistors Q1 and Q2, respectively. They are also connected by wiring lines to the collectors C of the constant current-source transistors Q4 and Q5, respectively. The bases B of the emitter-follower transistors Q6 and Q7 are connected to the pads 12 by wiring lines as is illustrated in FIG. 7. The collectors C of these transistors Q6 and Q7 are connected to each other by a wiring line. The collector node of the transistors Q6 and Q7 is connected to the main power line 13 by the auxiliary power line 13a.

The emitter-follower transistors Q6 and Q7, which constitute the input stage 16, are spaced apart from the ground line 14. Thus, the input stage 16 and the output stage 17 are electrically isolated from each other. This reduces the noise in the output circuit 15. Since the signal lines connecting the input stage 16 to the output stage 17 extend over the ground line 14, the signal lines are rather long. However, their inductance components do not affect the output signal of the output circuit 15, because the constant current-source transistors Q4 and Q5 for the emitter follower circuit (Q6 and Q7) are arranged close to, and symmetrically with respect to, the constant current-source transistor Q3. As a result, the output signal of the device 15 has a stable, desired waveform.

Since each output circuit device 15 has its components arranged as shown in FIG. 8, the crosstalk between any two adjacent devices 15 incorporated in the IC chip 11 can be decreased without increasing the strength of the power line 13 or ground line 14.

Figure 9:
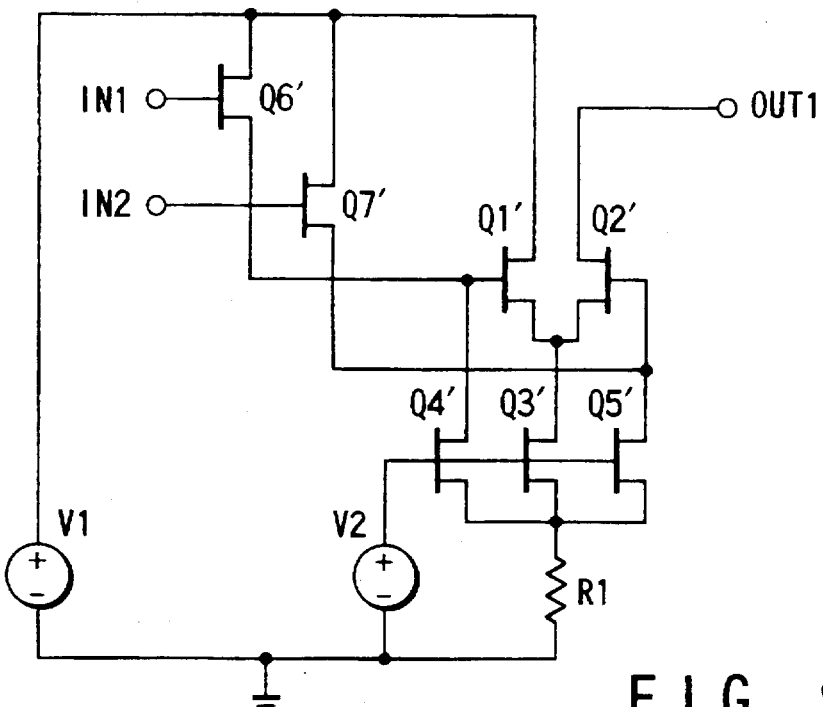
FIG. 9 is a circuit diagram of an output circuit device according to a third embodiment of the present invention, which incorporate FETs.
Figure 10:
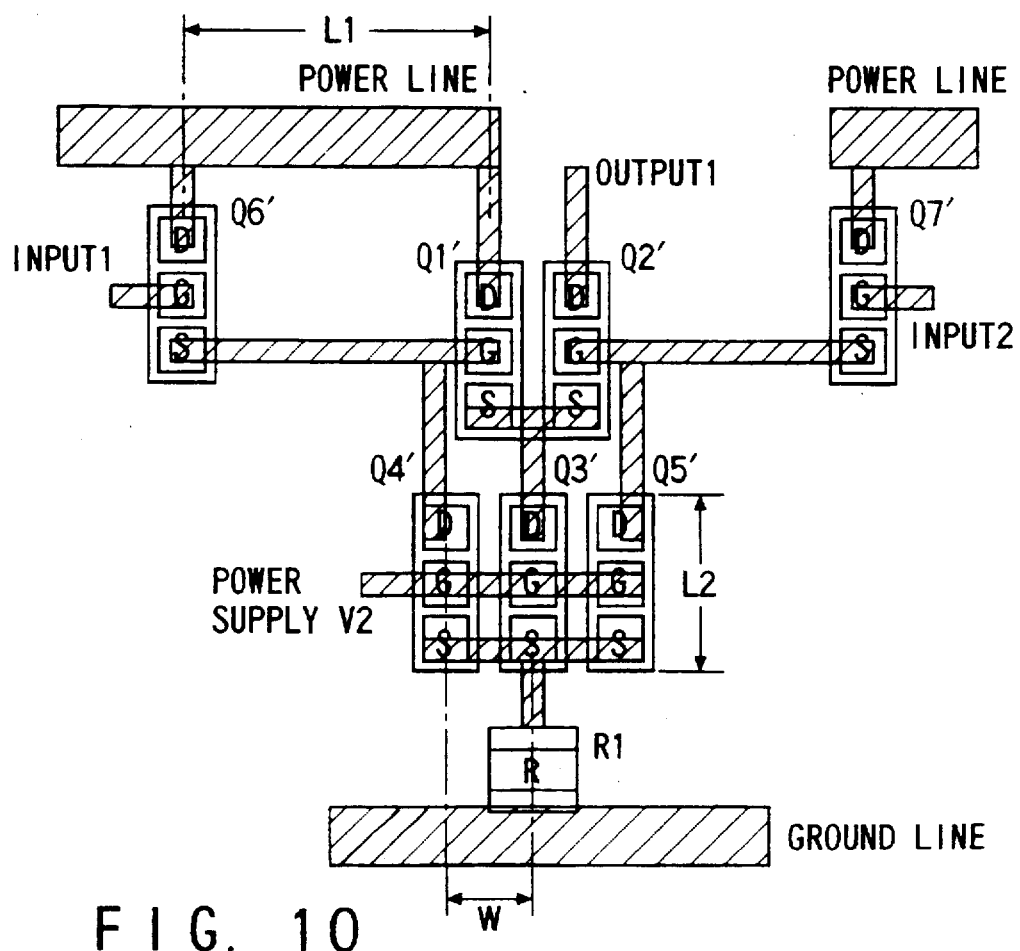
FIG. 10 is a diagram showing the component layout of the device shown in FIG. 9.

The transistors Q1 to Q7 used in the first and second embodiments described above are bipolar transistors. Nonetheless, field-effect transistors (FETs) can be used instead, in the present invention. FIGS. 9 and 10 show an output circuit and output circuit device according to the third embodiment of the invention, which comprises FETs Q1' to Q7'. More precisely, FIG. 9 is a circuit diagram of the output circuit, and FIG. 10 is a diagram illustrating the component layout of the device.

As shown in FIG. 9, the output circuit device comprises two input terminals IN1 and IN2, an output terminal OUT 1, power supplies V1 and V2, a resistor R1, an output terminal OUT1, a source follower circuit and a differential circuit. The differential circuit, or the output stage of the device, is composed of a pair of FETs Q1' and Q2' and an FET Q3'. The FET Q3' constitutes a constant current source. The source follower circuit, which is the input stage of the device, is comprised of a pair of source followers. The first source follower includes two FETs Q4' and Q6'. The FET Q4' constitutes a constant current source. The FET Q6' is connected to the first input terminal IN1. The second source follower includes two FETs Q5' and Q7'. The FET Q5' constitutes a constant current source. The FET Q7' is connected to the second input terminal IN2.

In the differential circuit, the differential FETs Q1' and Q2' have their sources connected to each other. The source node of the FETs Q1' and Q2' is connected to the ground by the drain-source path of the constant current-source FET Q3' and by the resistor R1. The drain of the differential FET Q1' is connected to the power supply V1, while the drain of the differential FET Q2' is connected to the output terminal OUT 1.

In the input-stage source follower circuit, the source-follower FETs Q6' and Q7' have their gates connected to the input terminals IN1 and IN2, respectively, their drains (i.e., charge-collecting terminals) connected to the power supply V1 and their sources (i.e., charge-injecting terminals) connected to the gates (i.e., control terminals) of the differential FETs Q1' and Q2', respectively. The sources of the source-follower FETs Q6' and Q7' are connected to the drains of the constant current-source FETs Q4' and Q5' near the differential FETS Q1' and Q2', respectively. The gates of the constant current-source FETs Q4' and Q5' are connected in parallel to the power supply V2.

When differential signals are input to the source-follower FETs Q6' and Q7' through the input terminals IN1 and IN2, the differential FETs Q1' and Q2' operate, whereby the differential circuit generates a large current. Namely, the high-frequency signals input to the source follower circuit (Q6' and Q7') are converted into a large current, which is supplied to, for example, a laser diode.

The output circuit shown in FIG. 9 is integrated as illustrated in FIG. 10. In the integrated output circuit device of FIG. 10, the FETs Q1' to Q7' are schematically represented. The squares D, squares G and squares S designate the drains terminals, gate terminals and source terminals of the FETs Q1' to Q7'

As seen From FIG. 10, the regions of the constant current-source FETs Q4' and Q5' of the input stage are located near the region of the constant current-source FET Q3' of the output stage, and symmetrically with respect the center thereof. On one side (i.e., the upper side in FIG. 10) of the area along the longitudinal direction of the regions of the constant current source FETs Q3', Q4' and Q5', there are the regions of the differential FETs Q1' and Q2'. The regions of the source-follower FETs Q6' and Q7' are provided at a relatively long distance respectively from the regions of the differential FETs Q1' and Q2'. The region of the resistor R1 is located on the other side (i.e., the lower side in FIG. 10) of the area along the longitudinal direction of the regions of the FETs Q3', Q4' and Q5'. The region of the transistor R1 is connected to a ground line provided near this region. Power lines are provided close to the FETs Q1', Q2', Q6' and Q7'. Wiring lines are connected to the drains D of these FETs Q1', Q2' and Q6' and Q7'.

The sources S of the source-follower FETs Q6' and Q7' are connected to the gages G of the differential FETs Q1' and Q2', respectively, by comparatively long wiring lines. The drains D of the current-source FETs Q4' and Q5' of the source follower circuit are connected to the gates G of the differential FETs Q1' and Q2', respectively, by relatively short wiring lines, in the vicinity of the gates G of the differential FETs Q1' and Q2'.

The sources S of the differential FETs Q1' and Q2' are connected to each other by wiring lines. The source node of these FETs Q1' and Q2' is connected to the drain D of the FET Q3' incorporated in the differential circuit, or the output stage of the device. The gates G of the constant current-source FETs Q3', Q4' and Q5' are connected to the power supply V2 by wiring lines. The sources S of these FETs Q3', Q4' and Q5' are connected to the resistor R1.

As shown in FIG. 10, the differential FETs Q1' and Q2' of the output stage are arranged at a relatively long distance from the source-follower FETs Q6' and Q7' incorporated in the input stage; the current-source FETs Q4' and Q5' of the source follower are located near the current-source FET Q3' of the output stage; and the drains D of these FETs Q4' and Q5' are connected to the gates G of the differential FETs Q1' and Q2' by short wiring lines in the vicinity of the gates G thereof. Therefore, the output stage of the output circuit device, i.e., the gate terminals of the differential circuit, is more stable than otherwise. The output circuit device can output a drive signal at high speed, without causing ringing, though long wiring lines are used which connect the source follower circuit (i.e., the input stage) to the differential circuit (i.e., the output stage).

In the above embodiments, as shown in FIG. 10, the distance W between the region of the output-stage constant current transistor Q3' and the region of each of the input-stage current transistors Q4' and Q5' and the distance between the input stage transistor region and the output stage transistor region, i.e., the length L1 of the wiring line layer is set at W<L1/2. Also, the distance W between the output-stage current source transistor region and the input-stage current source transistor region is preferably set at a value lower than the longitudinal size L2 of the current source transistor region, i.e., W<L2.

In the third embodiment, the constant current circuit of the input stage is arranged near the constant current circuit of the output stage, thereby using short wiring lines connecting the constant current circuit of the input stage to the gates of the differential FETs of the output stage. The output impedance the constant current circuit of the input stage has with respect to the high-frequency input signals can therefore be sufficiently low. Hence, the output circuit device according to the third embodiment can reliably operate at high speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An output circuit device comprising:

a pair of input-stage transistor regions supplied with first and second signals;

a pair of output-stage differential transistor regions constituting an output-stage differential circuit;

an output-stage constant current source transistor region constituting a constant current source for the output-stage differential circuit;

a pair of wiring line layers connecting the input-stage transistor regions and the output-stage differential transistor regions to each other, respectively; and a pair of input-stage constant current-source transistor regions arranged near the output-stage constant current source transistor region and connected to control terminals of the output-stage differential transistor regions, respectively, in the vicinity of the differential transistor regions to reduce an impedance viewing from the output-stage differential transistors to the input-stage constant current sources, and wherein a distance between the input-stage constant current source transistor regions and the output-stage constant current source transistor region is set at a value lower than a longitudinal length of the output-stage constant current source transistor region.

2. The device according to claim 1, wherein the input-stage constant current source transistor regions are arranged symmetrically with respect to the output-stage constant current-source transistor region.

3. The device according to claim 1, wherein a distance L between the input-stage transistor regions and the output-stage differential transistor regions and a distance W between each of the input-stage constant current source transistor regions and the output-stage constant current source transistor region satisfies a relation of W<L/2.

4. The device according to claim 3, wherein the input-stage constant current source transistor regions are arranged symmetrically with respect to the output-stage constant current source transistor region.

* * * * *